United States Patent
Lu et al.

(10) Patent No.: US 7,217,648 B2
(45) Date of Patent: May 15, 2007

(54) POST-ESL POROGEN BURN-OUT FOR COPPER ELK INTEGRATION

(75) Inventors: Yung-Cheng Lu, Taipei (TW);
Ying-Tsung Chen, Chiayi (TW);
Zhen-Cheng Wu, Hsinchu (TW);
Pi-Tsung Chen, Tainan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/020,372

(22) Filed: Dec. 22, 2004

(65) Prior Publication Data

US 2006/0134906 A1  Jun. 22, 2006

(51) Int. Cl.
*H01L 21/4763* (2006.01)
(52) U.S. Cl. .................. 438/618; 257/E21.575
(58) Field of Classification Search .......... 438/618; 257/E21.575
See application file for complete search history.

(56) References Cited

U.S. PATENT DOCUMENTS

| | | | |
|---|---|---|---|
| 6,248,665 B1 | 6/2001 | Bao et al. | |
| 6,451,712 B1* | 9/2002 | Dalton et al. | 438/781 |
| 6,528,409 B1* | 3/2003 | Lopatin et al. | 438/618 |
| 6,740,685 B2 | 5/2004 | Li et al. | |
| 6,878,616 B1* | 4/2005 | Casey et al. | 438/623 |
| 6,943,121 B2* | 9/2005 | Leu et al. | 438/725 |
| 6,943,451 B2* | 9/2005 | Whitehair et al. | 257/774 |
| 7,018,918 B2* | 3/2006 | Kloster et al. | 438/623 |
| 2002/0074659 A1* | 6/2002 | Dalton et al. | 257/758 |
| 2003/0057414 A1* | 3/2003 | Dalton et al. | 257/3 |
| 2003/0181018 A1 | 9/2003 | Geusic et al. | |
| 2003/0218253 A1 | 11/2003 | Avanzino et al. | |
| 2003/0224156 A1* | 12/2003 | Kirner et al. | 428/312.2 |
| 2004/0058523 A1 | 3/2004 | Li et al. | |

(Continued)

OTHER PUBLICATIONS

Kohl, A.T., et al., "Low *k*, Porous Methyl Silsequioxane and Spin-On-Glass," Electrochemical and Solid-State Letters, vol. 2, No. 2, (1999) pp. 77-79.

(Continued)

*Primary Examiner*—Michael Lebentritt
*Assistant Examiner*—Stanetta Isaac
(74) *Attorney, Agent, or Firm*—Slater & Matsil, L.L.P.

(57) ABSTRACT

A method of manufacturing a semiconductor device having a porous, low-k dielectric layer is provided. A preferred embodiment comprises the steps of forming a porogen-containing, low-k dielectric layer, in the damascene process. In preferred embodiments, pore generation, by e-beam porogen degradation, occurs after the steps of CMP planarizing the damascene copper conductor and depositing a semipermeable cap layer. In alternative embodiments, the cap layer consists essentially of silicon carbide, silicon nitride, Co, W, Al, Ta, Ti, Ni, Ru, and combinations thereof. The semipermeable cap layer is preferably deposited under PECVD conditions such that the cap layer is sufficiently permeable to enable removal of porogen degradation by-products. Preferred embodiments further include an in-situ $N_2/NH_3$ treatment before depositing the semipermeable cap layer.

19 Claims, 2 Drawing Sheets

U.S. PATENT DOCUMENTS

| | | | |
|---|---|---|---|
| 2004/0084774 A1* | 5/2004 | Li et al. ..................... 257/758 |
| 2004/0121583 A1 | 6/2004 | Bao et al. |
| 2004/0130027 A1 | 7/2004 | Chen et al. |
| 2004/0130032 A1 | 7/2004 | Gronbeck et al. |
| 2004/0137728 A1 | 7/2004 | Gallagher et al. |
| 2004/0175958 A1 | 9/2004 | Lin et al. |
| 2005/0133920 A1* | 6/2005 | Liou et al. ................. 257/758 |
| 2005/0227502 A1* | 10/2005 | Schmitt et al. ............ 438/788 |
| 2005/0230834 A1* | 10/2005 | Schmitt et al. ............ 257/758 |
| 2006/0043591 A1* | 3/2006 | Yim et al. .................. 257/758 |
| 2006/0063393 A1* | 3/2006 | Shaffer et al. ............. 438/780 |

OTHER PUBLICATIONS

Hedden, R.C., et al., "Comparison of Curing Processes for Porous Dielectrics: Measurements from Specular X-Ray Reflectivity," Journal of the Electrochemical Society, vol. 151, No. 8 (2004) pp. F178-F181.

Fayolle, M., et al., "Cu/ULK Integration Using a Post Integration Porogen Removal Approach," Proceedings of the IEEE 2004 International Interconnect Technology Conference (Jun. 2004) pp. 208-210.

* cited by examiner

POST-ESL POROGEN BURN-OUT FOR COPPER ELK INTEGRATION

TECHNICAL FIELD

This invention relates generally to semiconductor device fabrication and more particularly to a method for forming a porous, low-k dielectric layer.

BACKGROUND

An important objective in the advancement of integrated circuit (IC) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the density of integrated circuit structures continually increases, the distance between the interconnect structures decreases. As the distance between the interconnect structures decreases, a dielectric material with a low dielectric constant (i.e., a low-k dielectric material) is desired for the insulating layer. The insulating layer being comprised of the dielectric material with a low dielectric constant results in lower capacitance between the interconnect structures. Such lower capacitance results in higher speed performance of the integrated circuit and also in lower power dissipation. In addition, such lower capacitance results in lower cross talk between the interconnect structures. Lower cross talk between interconnect structures is especially advantageous when the interconnect structures are disposed closer together as device density increases.

One example of a dielectric material with a low dielectric constant for the insulating layer is a porous dielectric material having pores throughout. One type of porous low-k dielectric material is formed from a low-k precursor material comprised of a thermosetting host material and a thermally degradable porogen material. In that case, a solution of the uncured, low-k, precursor material is applied by a spin-on process, and then a thermal process is performed for curing the low-k precursor material to form the porous low-k dielectric material. The thermal process causes curing of the low-k precursor material with cross-linking of the host material to form a low-k dielectric matrix and concurrently with phase separation of the porogen from the host material. The phase-separated porogen collects in nanoscopic domains within the host material and thermally decomposes into volatile by-products (i.e., porogen fragments) that diffuse out of the low-k dielectric material leaving nanopores in their place.

Integration of porous dielectrics into conventional device fabrication schemes has created new problems. The open and interconnected porosity of the dielectrics allow reactive gases and chemicals to easily penetrate into the porous structure and damage the bulk material. Particularly degrading processes are photoresist removal and metal deposition. Moreover, the introduction of nanopores drastically deteriorates the mechanical properties of the film thereby limiting the yield of chemical mechanical polishing in copper-ELK (extreme low-k dielectric) process integration.

To overcome these issues, a new integration approach is needed in order to realize the full advantages of low-k, porous dielectrics.

SUMMARY OF THE INVENTION

These and other problems are generally solved or circumvented, and technical advantages are generally achieved, by preferred embodiments of the present invention comprising a method for formation of a porous, low-k dielectric.

A preferred embodiment comprises the steps of forming a porogen-containing, low-k dielectric layer in the damascene process. In preferred embodiments, pore generation by porogen e-beam curing occurs after the steps of planarizing the damascene copper conductor and depositing a semipermeable cap layer. Preferred embodiments advantageously avoid dielectric shrinkage caused by reaction of the porogen. Preferred embodiments also avoid a pore sealing manufacturing step before building the damascene structure.

In alternative preferred embodiments, the cap layer includes at least one layer of silicon carbide, silicon nitride, Co, W, Al, Ta, Ti, Ni, Ru, or combinations thereof. The cap layer may further include less than about 5% of the porogen, wherein the small percentage of porogen enhances removal of porogen reaction by-products. In preferred embodiments, PECVD deposition conditions produce a semipermeable cap layer that permits removal of the porogen by-products. Other embodiments further include an in-situ N2/NH3 treatment before depositing the semipermeable cap layer.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention.

The specific embodiments discussed are merely illustrative of specific ways to make and use the invention, and do not limit the scope of the invention or the appended claims.

This invention relates generally to semiconductor device fabrication and more specifically to porous, low-k dielectric formation by degradation of a porogen. This integration scheme uses a spun-on, dielectric material in a non-porous state that withstands the processing steps associated with advanced interconnect fabrication. Device fabrication steps such as etching, lithography, metal deposition, and CMP can be accomplished on a non-porous dielectric. The porogen degradation is performed after interlevel integration.

The present invention will now be described with respect to preferred embodiments in a specific context, namely the creation of a low-k ILD and copper conductive lines in the damascene process. It is believed that embodiments of this invention are particularly advantageous in the damascene interconnect process. It is further believed that embodiments described herein will benefit other integrated circuit porogen applications not specifically mentioned. Therefore, the specific embodiments discussed are merely illustrative of specific ways to make and use the invention, and do not limit the scope of the invention.

Figure 1:
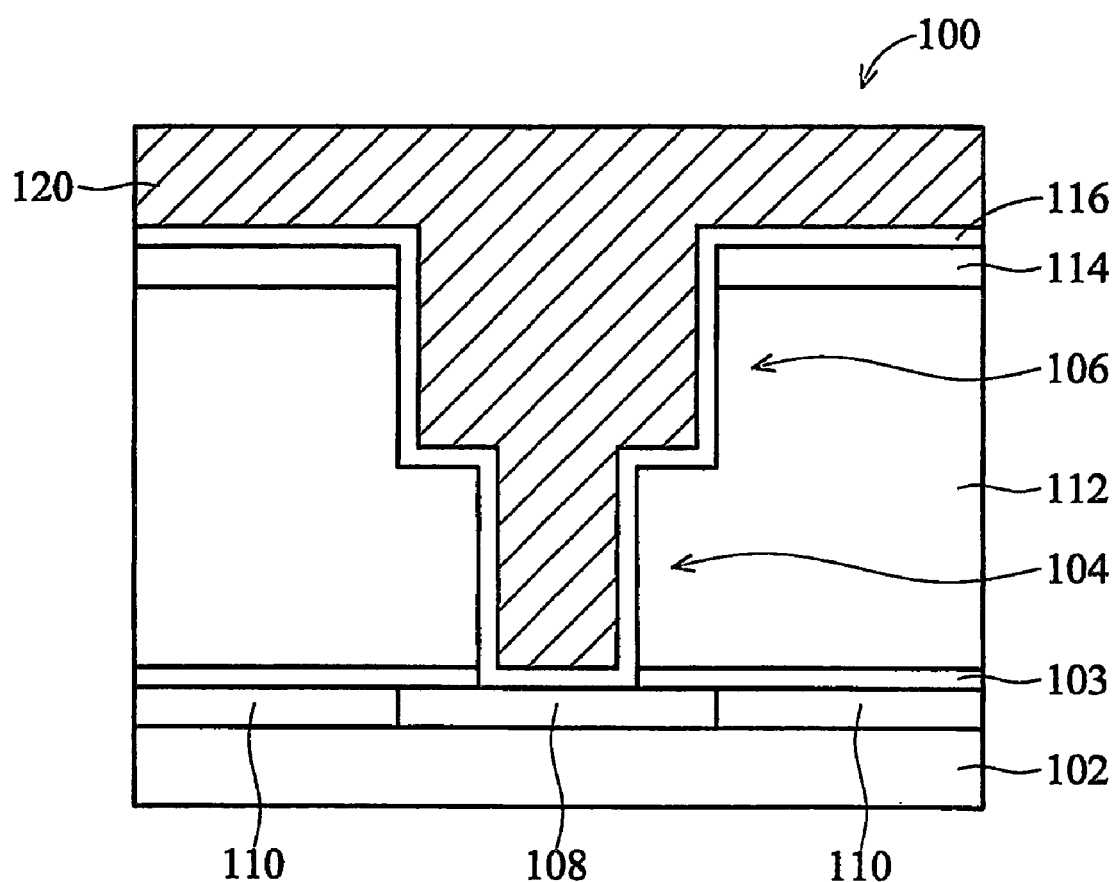
FIG. 1 is a cross sectional view of a semiconductor device at an intermediate step in an exemplary damascene process further illustrating a blanket conductor layer and a non-porous low-k dielectric according to preferred embodiments.

Referring now to FIG. 1, there is shown a cross section of the representative intermediate damscene structure 100 created on the surface of a semiconductor substrate 102. The details of the damascene process are described by Bao et al. in U.S. Pat. No. 6,248,665 and in U.S. Application No. 2004/0121583, both of which are hereby incorporated by reference.

Referring to FIG. 1, there is shown a cross sectional, side view representation of an anisotropically etched, dual damascene structure 100 at an intermediate fabrication stage. Within damascene structure 100 is a recessed feature or opening having a via portion 104 and an overlying trench line portion 106. While there are several ways to form a dual damascene structure 100, one approach involves at least two photolithographic patterning and anisotropic etching steps to first form via openings 104 followed by a similar process to form overlying trench line openings 106 encompassing one or more via openings 104.

Still referring to FIG. 1, a first etch stop layer 103, formed of, for example silicon nitride ($Si_3N_4$), is deposited over a conductive region 108, wherein the conductive region is formed in an underlying dielectric insulating layer 110. Conductive region 108 may include a copper interconnect or yet another damascene structure, for example. In accordance with the conventional damascene process, the word copper is known to include suitable copper alloys. Overlying the first etch stop layer 103 is an insulating dielectric layer 112, also referred to as an inter-level dielectric (ILD) layer. Insulating layer 112 includes an unreacted, pore-generating material, or porogen.

By way of example, Dow Chemical's porous SILK product and JSR Corporation's JSR 5109 are suitable, commercially available low-k precursors that utilize an organic host material. In preferred embodiments, the low-k dielectric comprises Shipley's commercially available Zirkon™ LK. Zirkon™ LK is a blend of a methylsilsesquioxane (MSQ) based material with acrylic, polymer-based. nano-particle porogen dispersed in a solvent (such as PGMEA). The dielectric constant of Zirkon™ LK, after porogen removal, has been reported in the art as being 2.5.

Zirkon™ LK is preferably deposited using a conventional spin coater. After depositing, it is partially cured, preferably in a vertical furnace between about 250 and 300° C. in order to cross-link the matrix. Degradation of the Zirkon™ LK porogen begins at about 275° C., and complete degradation, or curing, occurs at about 450° C. Therefore, in preferred embodiments, cross-linking, as well as the integration steps (photolithography, etching, resist removal, metallization, CMP, and post-CMP cap layer deposition), are preferably performed at temperatures less than about 275° C.

Still referring to FIG. 1, an ILD-covering dielectric layer, for example etch stop layer (ESL) 114, is formed overlying the ILD layer 112. The etch stop layer 114 may include, for example, silicon nitride and/or silicon oxynitride (SiON). Etch stop layer 114 is preferably about 500 Å to 1500 Å thick.

The dual damascene structure 100 is formed by first sequentially photolithographically patterning and anisotropically etching the via opening 104 through the etch stop layer 114, the ILD layer 112, and at least partially through the first etch stop layer 103. This is followed by a similar process to photolithographically pattern and anisotropically etch a trench opening 106 through the etch stop layer 114 and a portion of the ILD layer 112. These steps form a trench opening 106 overlying and encompassing the via opening 104. It will be appreciated that the french opening 106 may encompass additional via openings (not shown) and that the trench opening 106 and via opening 104 may alternately be formed in separate stacked ILD layers including another etch stop layer formed between the respective ILD layers.

Still referring to FIG. 1, a barrier layer 116 is blanket deposited to line at least the dual damascene opening. The barrier layer is preferably about 10 to 30 Angstroms thick, and it forms a barrier for Cu diffusion. The barrier layer may consist of TaN, TiN, WN, TbN, VN, ZrN, CrN, WC, WN, WCN, NbN, AlN, or combinations thereof. The barrier layer may be applied using PVD, CVD, PECVD, PEALD. In preferred embodiments, the barrier layer 116 comprises TaN, and it is deposited using ALD.

An ALD deposited, TaN diffusion barrier is particularly advantageous in forming a damascene structure 100 with reduced capacitance and reduced electromigration effects. Preferred embodiments may optionally contain a glue layer (not shown) between the barrier layer 116 and an overlaying conductor. Applying a glue layer enhances adhesion between copper lines and adjacent layers. The glue layer preferably contains materials that bonds with copper and/or the underlying barrier layer. A glue layer may be about 10 to 500 Angstroms thick. It is preferably comprised of metal-rich, e.g. titanium-rich, titanium nitride (Ti rich TiN). In metal-rich, nitrided glue layers, the ratio of nitrogen to metal is preferably less than one, e.g. Ti/N<1 (atomic ratio).

In alternative embodiments, the glue layer (not shown) preferably comprises two layers. The first layer is a metal-rich thin layer from about 130 to 170 Angstroms, preferably about 150 Angstroms. The second layer is a stoichiometric metal nitride layer about 500 to 600 Angstroms, preferably about 550 Angstroms. The glue layer may be applied using PVD, CVD, PECVD, PEALD, and, preferably, ALD. Alternative embodiments include a glue layer consisting of Ru, Ta, Ti, W, Co, Ni, Al, Nb, AlCu, or combinations thereof. In preferred embodiments, the ratio of the glue layer thickness to the diffusion layer thickness is about 1 to 50.

Still referring to FIG. 1, following deposition of barrier layer 116, a copper layer 120 is blanket deposited according to a conventional process. The copper fills the dual damascene french 106 and via opening 104 including an overlying portion above the trench level. Although other copper filling methods such as PVD and CVD may be used, electroplating (electrodeposition) is preferred because of its superior gap-filling and step coverage. Prior to electrodeposition, a seed layer of copper (not shown) is deposited over the barrier layer 116 by, for example, PVD and/or CVD. The copper seed layer is preferably deposited to form a continuous layer over the wafer process surface thereby providing a continuously conductive surface for depositing the bulk of the copper during the electrochemical deposition (ECD) process.

Figure 2:
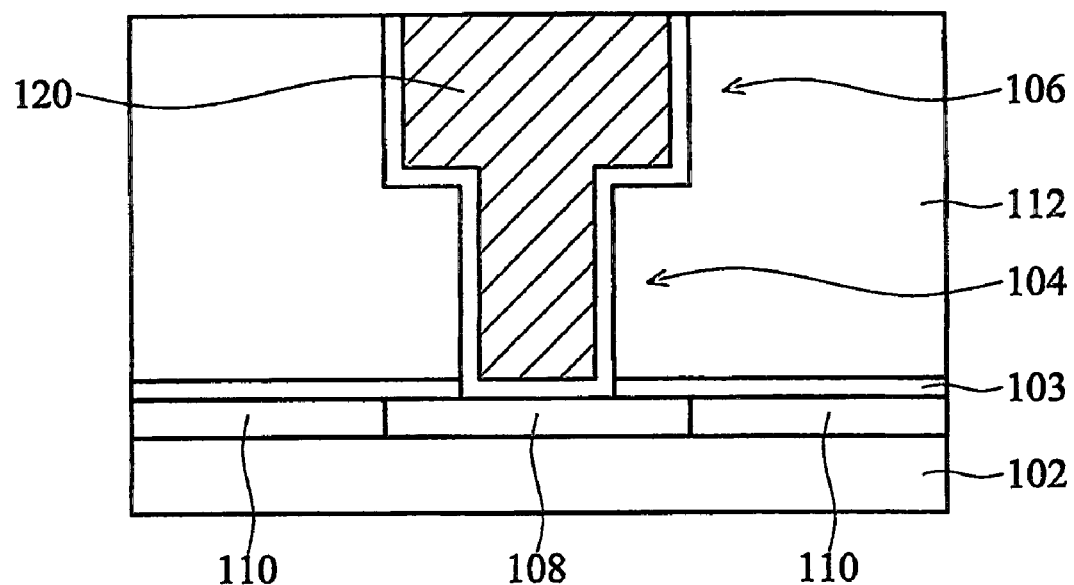
FIG. 2 is cross-sectional view showing a post-CMP, planarized intermediate damascene structure and a non-porous low-k dielectric according to preferred embodiments.

Referring now to FIG. 2, there is shown a schematic cross-sectional diagram illustrating the results of the further processing of the intermediate damascene structure whose schematic cross-sectional diagram is illustrated in FIG. 1. Shown in FIG. 2 is an illustration otherwise equivalent to that in FIG. 1, but wherein the copper layer 120 has been planarized and etch stop layer 114 (FIG. 1) has been completely removed. In alternative embodiments (not shown) ESL layer 114 (FIG. 1) may be partially planarized so that some ESL remains and is co-planer with copper layer 120. Within preferred embodiments the copper layer 120 may be completely planarized using conventional CMP planarizing methods.

Figure 3:
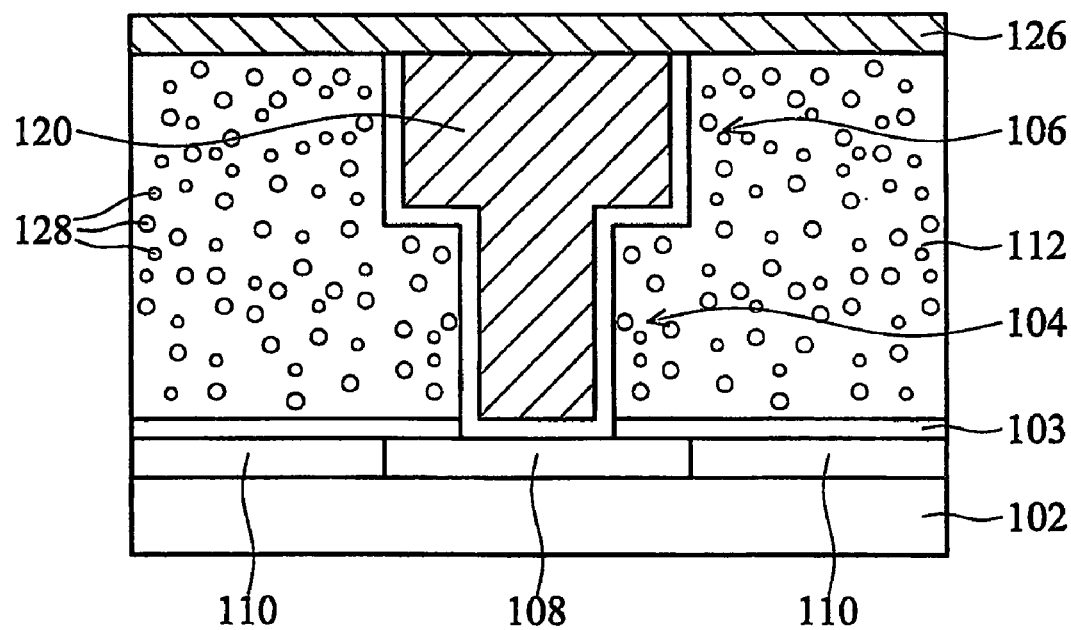
FIG. 3 is a cross-sectional view showing post-cap layer, porous low-k dielectric according to preferred embodiments.

Referring to FIG. 3, in an embodiment of the present invention, a cap layer 126, or etch stop layer ESL, is deposited over the damascene structure following CMP. However, immediately before depositing the cap layer 126, an in situ $N_2/NH_3$ treatment is performed. This treatment reduces any copper oxide on copper layer 120 to elemental copper, thereby improving cap layer 126 adhesion to copper layer 120. The $N_2/NH_3$ treatment is performed at about 250 to 400° C. at about 1 to 10 Torr for about 5 to 60 seconds. Gas flow rates are about 100 to 1000 sccm for $NH_3$ and about 100 to 20000 sccm for $N_2$. An RF power source of about 50 to 1000 W is used.

Continuing with FIG. 3, cap layer 126 is preferably deposited to a thickness of about 50 Angstroms to 500 Angstroms. In alternative embodiments (not shown) a diffusion barrier may be interposed between copper layer 120 and cap layer 126. Cap layer 126 is deposited by conventional ALD, PVD, PECVD, PEALD, and/or CVD methods, including nitridation and silicidation methods known in the art. The cap layer 126 may include at least one layer of silicon carbide, silicon nitride, Co, W, Al, Ta, Ti, Ni, or Ru. Still other embodiments may include a cap layer comprising at least one layer of a carbon-containing dielectric, a nitrogen-containing dielectric, a nitrogen-containing conductive layer, or a silicon-containing layer.

The cap layer 126 may include about a few percent of a porogen, preferably less than about 5%, to be degraded at a temperature slightly lower than the degradation temperature of the porogen in low-k layer 112. This creates a semipermeable cap layer to allow for escape of porogen by-products. In one embodiment, the cap layer 126 comprises Shipley's Zirkon™ HM, which is a spin-on methylsilsesquioxane (MSQ) and less than about 5% acrylic, nanoparticle porogen. In accordance with embodiments, there is advantageously almost no dielectric shrinkage.

In preferred embodiments, the cap layer 126 is deposited by PECVD using an $H_xSiR_{(1-x)}$ precursor, wherein R is $CH_3$ or $C_6H_5$ in an ambient such as $NH_3$, He, or Ar, and a combination thereof. Preferred embodiments include depositing a silicon carbide cap layer 126. The PECVD deposition conditions are preferably about 250 to 400° C. and about 1 to 10 Torr. The precursor flow rate is about 50 to 600 sccm. Gas flow rates are about 100 to 2000 sccm for $NH_3$, about 100 to 2000 sccm for He, and about 100 to 2000 sccm for Ar. An RF power source of about 50 to 600 W is used. A cap layer deposited according to preferred embodiments is advantageously sufficiently permeable to allow removal of the porogen decomposition or curing by-products.

Still referring to FIG. 3, following application of cap layer 126, the structure preferably undergoes the final dielectric cure, thereby resulting in-the final, pore-containing dielectric 112 shown in FIG. 3. After the steps of planarizing the copper conductor and depositing a semipermeable cap layer, the porogen nano-particles of the dielectric 112 are chemically removed by a decomposition treatment.

In alternative embodiments, removing the porogen includes a plasma process or a UV process.

In preferred embodiments, an e-beam process removes the porogen. The e-beam process includes using an electron beam at about 2 to 5 kV and about 20 to 150 $\mu Coulomb/cm^2$ at about 250 to 400° C. until the porogen is sufficiently removed.

In conventional methods, the porogen is removed before building the damascene structure 100. This leaves open pores on the dielectric's surface, which allows chemicals to enter the pores, thereby raising the dielectric constant. An advantage of preferred embodiments is that significant cost savings achieved by avoiding this pore-sealing step.

The embodiments of the invention described above are exemplary and not limiting. Variations apparent to those skilled in the art that include the features of the invention are within the scope of the invention and the appended claims. Although embodiments of the present invention and their advantages have been described in detail, it should be understood that various changes, substitutions and alterations can be made herein without departing from the spirit and scope of the invention as defined by the appended claims.

For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device having a porous dielectric layer, the method comprising the steps of:

forming a low-k dielectric layer comprising a dielectric material and a porogen, the low-k dielectric layer having an outer surface and forming a recess with a recessed feature, wherein the dielectric layer contains a porogen;

fabricating an interconnect structure in the recess with a conductor therein;

forming a cap layer over the interconnect and the outer surface of the dielectric layer after fabricating the interconnect structure; and removing the porogen from the low-k dielectric layer after the step of forming the cap layer.

2. The method of claim 1, wherein forming the cap layer includes reacting $H_xSiR_{(1-x)}$, wherein R is $CH_3$ or $C_6H_5$, in an ambient consisting essentially of $NH_3$, He, Ar, and combinations thereof.

3. The method of claim 2, wherein forming the cap layer further includes a PECVD deposition at about 250 to 400° C.

4. The method of claim 1, wherein the cap layer includes at least one layer consisting essentially of silicon carbide, silicon nitride, Co, W, Al, Ta, Ti, Ni, Ru, and combinations thereof.

5. The method of claim 1, wherein removing the poragen comprises using an e-beam having about 20 to 150 mCoulomb/cm².

6. The method of claim 1, wherein removing the porogen comprises heating the semiconductor device at about 250 to 400° C. until the porogen is removed.

7. The method of claim 1, further including an in-situ $N_2/NH_3$ treatment before depositing the cap layer.

8. The method of claim 7, wherein the in-situ $N_2/NH_3$ treatment comprises heating at about 250 to 400° C. at a pressure of approximately 1 to 10 Torr.

9. The method of claim 1, wherein the porogen includes an acrylic particle.

10. The method of claim 1, wherein removing the porogen includes degrading an acrylic, polymer-based, nano-particle dispersed within an organic host.

11. The method of claim 1, further including maintaining a temperature less than about 275° C. before the step of removing the porogen.

12. The method of claim 1, wherein fabricating the interconnect structure includes planarizing the interconnect structure.

13. The method of claim 1, wherein the cap layer comprises a porogen.

14. A method of forming a semiconductor device having a porous dielectric layer, the method comprising the steps of:

funning a low-k dielectric layer, wherein the dielectric layer contains a porogen; the porogen having a decomposition temperature;

fabricating an interconnect structure comprising a copper conductive wherein the fabricating includes maintaining a temperature below the decomposition temperature, and planarizing the copper conductor;

forming a semipermeable cap layer over the dielectric layer and the interconnect structure after planarizing the copper conductor; and generating pores in the dielectric layer by removing the porogen after the steps of planarizing the copper conductor and depositing the semipermeable cap layer.

15. The method of claim 14, wherein forming a semipermeable cap layer includes forming silicon carbide by reacting $H_xSiR_{(1-x)}$, wherein R is $CH_3$ or $C_6H_5$, in an ambient consisting essentially of $NH_3$, He, Ar, and combinations thereof.

16. The method of claim 14, wherein the cap layer includes at least one layer of silicon carbide, silicon nitride, Co, W, Al, Ta, Ti, Ni, Ru, and combinations thereof.

17. The method of claim 14, further comprising an in-situ $N_2/NH_3$ treatment before depositing a semipermeable cap layer.

18. The method of claim 17, wherein the in-situ $N_2/NH_3$ treatment comprises heating at about 250 to 400° C. at a pressure of about 1 to 10 Torr for less than about 1 minute.

19. The method of claim 14, wherein the porogen includes and acrylic particle.

* * * * *

UNITED STATES PATENT AND TRADEMARK OFFICE
CERTIFICATE OF CORRECTION

PATENT NO. : 7,217,648 B2 Page 1 of 1
APPLICATION NO. : 11/020372
DATED : May 15, 2007
INVENTOR(S) : Lu et al.

It is certified that error appears in the above-identified patent and that said Letters Patent is hereby corrected as shown below:

Column 7, line 12; delete "poragen" insert --porogen--
Column 8, line 3; delete "funning" insert --forming--

Signed and Sealed this

Tenth Day of July, 2007

JON W. DUDAS
*Director of the United States Patent and Trademark Office*